(12) United States Patent
Zheng et al.

(10) Patent No.: US 10,978,134 B1
(45) Date of Patent: Apr. 13, 2021

(54) METHOD AND DEVICE FOR REFRESHING MEMORY

(71) Applicant: ALIBABA GROUP HOLDING LIMITED, Grand Cayman (KY)

(72) Inventors: Hongzhong Zheng, San Mateo, CA (US); Dimin Niu, San Mateo, CA (US); Shuangchen Li, San Mateo, CA (US)

(73) Assignee: ALIBABA GROUP HOLDING LIMITED, Grand Cayman (KY)

( * ) Notice: Subject to any disclaimer, the term of this patent is extended or adjusted under 35 U.S.C. 154(b) by 0 days.

(21) Appl. No.: 16/730,740

(22) Filed: Dec. 30, 2019

(51) Int. Cl.
  *G11C 11/40* (2006.01)
  *G11C 11/406* (2006.01)
  *G06N 3/04* (2006.01)
  *G06N 3/08* (2006.01)

(52) U.S. Cl.
  CPC .......... *G11C 11/40611* (2013.01); *G06N 3/04* (2013.01); *G06N 3/08* (2013.01); *G11C 11/40615* (2013.01)

(58) Field of Classification Search
  None
  See application file for complete search history.

(56) References Cited

U.S. PATENT DOCUMENTS

| | | | | |
|---|---|---|---|---|
| 5,373,475 | A | * 12/1994 | Nagase | ................. G11C 11/406 365/222 |
| 2011/0225465 | A1 | * 9/2011 | Blackmon | ............. G06F 11/076 714/54 |
| 2014/0016423 | A1 | * 1/2014 | Ware | ................. G11C 11/40622 365/222 |
| 2017/0110177 | A1 | * 4/2017 | Lee | ........................ G06F 3/0683 |
| 2020/0342284 | A1 | * 10/2020 | Buyuktosunoglu | ... G06F 3/0653 |

* cited by examiner

*Primary Examiner* — Tan T. Nguyen
(74) *Attorney, Agent, or Firm* — Finnegan, Henderson, Farabow, Garrett & Dunner, LLP

(57) ABSTRACT

The present disclosure provides devices and methods for refreshing memory. The method includes receiving information of a memory array in an accelerator coupled to a host device, and when the accelerator operates in a first refresh mode, based on the received information: disabling one or more refresh operations of a memory controller; and refreshing one or more rows of the memory array by the host device.

27 Claims, 8 Drawing Sheets

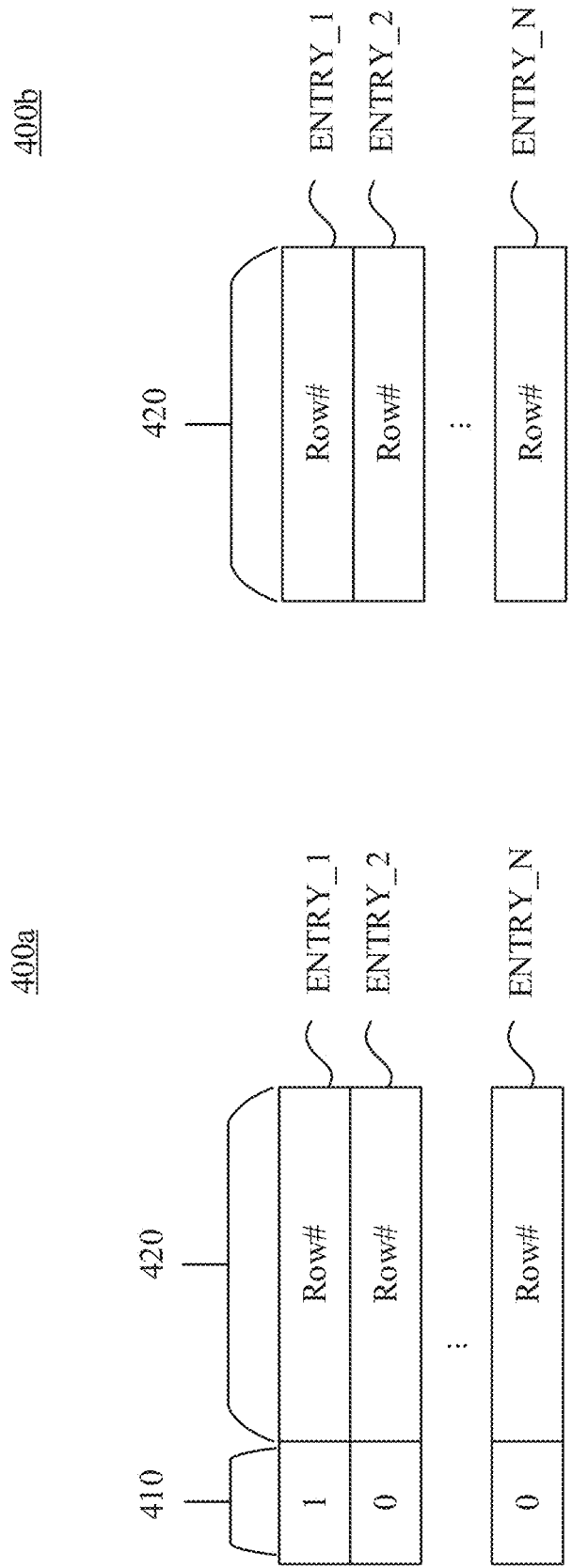

METHOD AND DEVICE FOR REFRESHING MEMORY

BACKGROUND

Dynamic Random-Access Memory (DRAM) or Embedded Dynamic Random-Access Memory (eDRAM) devices are widely used in data centers or servers in cloud computation systems. With the increasing number of applications, such as artificial intelligence (AI) applications, being migrated to cloud computation, data centers are confronted with challenges in terms of managing workload such as neural network computing tasks.

In a DRAM/eDRAM architecture, data is stored as electrical charge in a capacitor of memory cells. Since electrical charge leaks over time due to leakages such as junction leakage, gate-induced drain leakage, off-leakage, field transistor leakage, and capacitor dielectric leakage, the memory cells storing information need to be refreshed or accessed at least once within its retention time to preserve the data before an erroneous readout occurs. As the size of DRAM increases, undesired refresh overhead and penalty, including the energy consumption, instruction per cycle (IPC) penalty and memory access latency, may also increase significantly, which results in limited performance and poor energy-efficiency.

SUMMARY OF THE DISCLOSURE

Embodiments of the disclosure provide a method for refreshing memory. The method includes receiving information of a memory array in an accelerator; when the accelerator operates in a first refresh mode, based on the received information: disabling one or more refresh operations of a memory controller; and refreshing one or more rows of the memory array by the host device.

Embodiments of the disclosure also provide an accelerator configured to be coupled to a host device. The accelerator includes a memory array configured to store data and a memory controller configured to access the memory array. The accelerator is configured to operate in a refresh mode that includes a first refresh mode. In the first refresh mode, the memory controller is configured to have one or more refresh operations that are disabled, and the memory array is configured to have one or more rows that are to be refreshed by the host device.

Embodiments of the disclosure further provide a non-transitory computer-readable medium that stores a set of instructions that is executable by one or more processors of a host device to cause the host device to perform a method for refreshing memory. The method for refreshing memory includes receiving information of a memory array in an accelerator coupled to the host device; and when the accelerator operates in a first refresh mode, based on the received information: disabling one or more refresh operations of a memory controller; and refreshing one or more rows of the memory array by the host device.

It is to be understood that both the foregoing general description and the following detailed description are exemplary and explanatory only and are not restrictive of the disclosed embodiments.

BRIEF DESCRIPTION OF THE DRAWINGS

Embodiments and various aspects of the present disclosure are illustrated in the following detailed description and the accompanying figures. Various features shown in the figures are not drawn to scale.

FIG. 4A is a schematic diagram illustrating the structure of an exemplary mapping table, consistent with some embodiments of the present disclosure.

FIG. 4B is a schematic diagram illustrating the structure of an exemplary mapping table, consistent with some embodiments of the present disclosure.

DETAILED DESCRIPTION

Figure 1A:
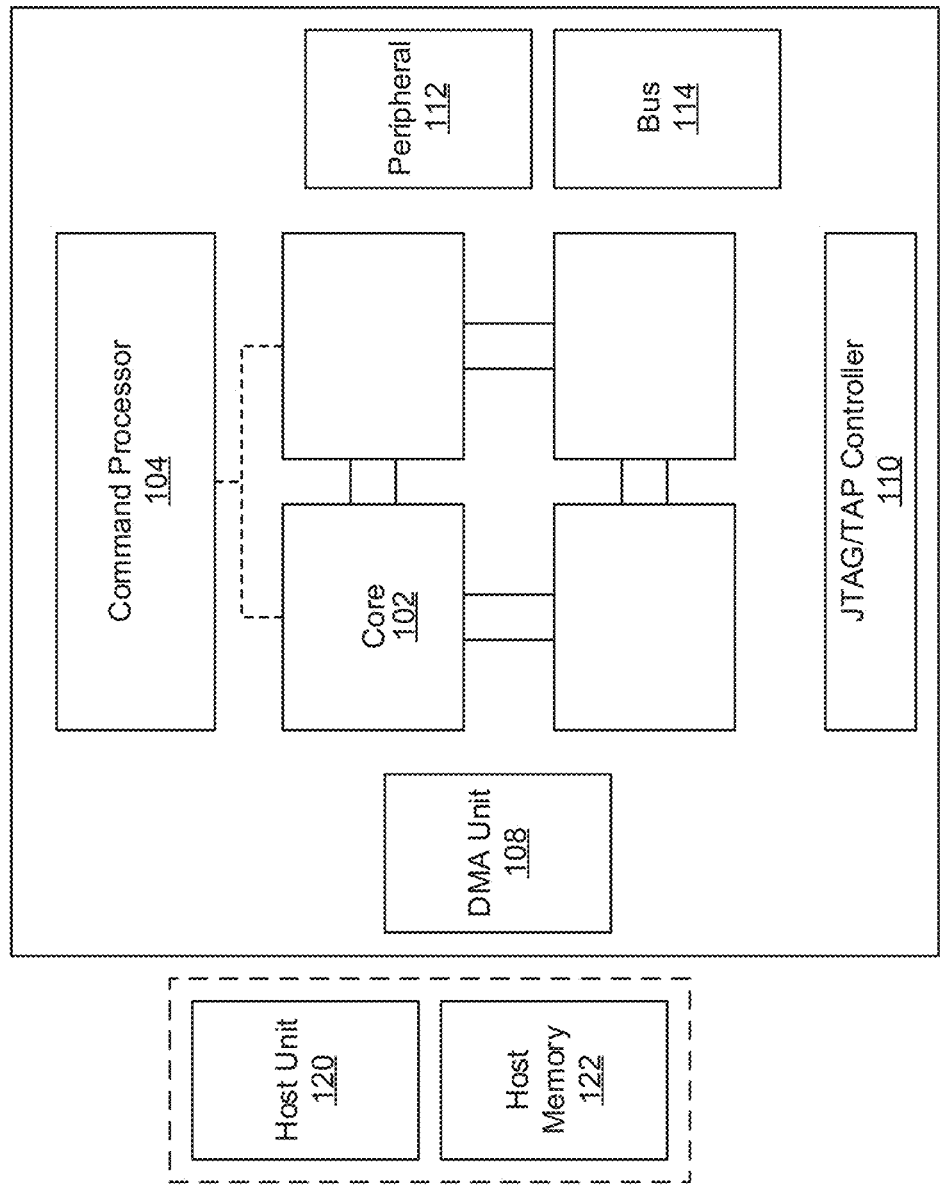
FIG. 1A illustrates an exemplary neural network accelerator architecture, consistent with some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses, systems and methods consistent with aspects related to the disclosure as recited in the appended claims. The terms and definitions provided herein control, if in conflict with terms or definitions incorporated by reference.

Unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C. As used herein, the terms "comprises," "comprising," or any other variation thereof are intended to cover a non-exclusive inclusion, such that a process, method, composition, article, or apparatus that comprises a list of elements does not include only those elements but may include other elements not expressly listed or inherent to such process, method, composition, article, or apparatus. The term "exemplary" is used in the sense of "example" rather than "ideal."

The embodiments disclosed herein can be used in various applications or environments, such as artificial intelligence (AI) training and inference, database and big data analytic acceleration, or the like. AI-related applications can involve neural network-based machine learning (ML) or deep learning (DL). For example, some embodiments can be utilized in neural network architectures, such as deep neural networks (DNNs), convolutional neural networks (CNNs), recurrent neural networks (RNNs), or the like. In addition, some embodiments can be configured for various processing architectures, such as neural network processing units (NPUs), graphics processing units (GPUs), field programmable gate arrays (FPGAs), tensor processing units (TPUs), application-specific integrated circuits (ASICs), any other types of heterogeneous accelerator processing units (HAPUs), or the like.

The term "accelerator" as used herein refers to a hardware for accelerating certain computation workload. For example, an accelerator can be configured to accelerate workload (e.g., neural network computing tasks) in any AI-related applications mentioned above. The accelerator having a Dynamic Random-Access Memory (DRAM) or an Embedded Dynamic Random-Access Memory (eDRAM) is known as a DRAM-based or an eDRAM-based accelerator.

Embodiments of the present disclosure mitigate the problems stated above by providing devices and methods for refreshing memory that perform refresh operations based on the lifetime or access pattern of data. The lifetime or access pattern of data used in AI-related applications relates to algorithms used in the application. The data can be allocated in the memory array based on its lifetime, to achieve row-wise or partition-wise refresh operations in different refresh modes. Accordingly, shortcomings of the DRAM-based or the eDRAM-based accelerator can be overcome by embodiments of the present disclosure. With the devices and the methods disclosed in various embodiments, refresh operations can be optimized, the performance of the accelerator can be improved, and the energy consumption of the accelerator can be reduced. Thus, various applications, including various cloud systems utilizing AI computation can benefit from the devices and methods for refreshing memory to speed up computations and increase energy-efficiency.

FIG. 1A illustrates an exemplary neural network accelerator architecture, consistent with embodiments of the present disclosure. In the context of this disclosure, a neural network accelerator may also be referred to as a machine learning accelerator or deep learning accelerator. In some embodiments, accelerator architecture 100 may be referred to as a neural network processing unit (NPU) architecture 100. As shown in FIG. 1A, accelerator architecture 100 can include a plurality of cores 102, a command processor 104, a direct memory access (DMA) unit 108, a Joint Test Action Group (JTAG)/Test Access End (TAP) controller 110, a peripheral interface 112, a bus 114, and the like.

It is appreciated that, cores 102 can perform algorithmic operations based on communicated data. Cores 102 can include one or more processing elements that may include single instruction, multiple data (SIMD) architecture including one or more processing units configured to perform one or more operations (e.g., multiplication, addition, multiply-accumulate, etc.) based on commands received from command processor 104. To perform the operation on the communicated data packets, cores 102 can include one or more processing elements for processing information in the data packets. Each processing element may comprise any number of processing units. According to some embodiments of the present disclosure, accelerator architecture 100 may include a plurality of cores 102, e.g., four cores. In some embodiments, the plurality of cores 102 can be communicatively coupled with each other. For example, the plurality of cores 102 can be connected with a single directional ring bus, which supports efficient pipelining for large neural network models. The architecture of cores 102 will be explained in detail with respect to FIG. 1B.

Command processor 104 can interact with a host unit 120 and pass pertinent commands and data to corresponding core 102. In some embodiments, command processor 104 can interact with host unit under the supervision of kernel mode driver (KMD). In some embodiments, command processor 104 can modify the pertinent commands to each core 102, so that cores 102 can work in parallel as much as possible. The modified commands can be stored in an instruction buffer. In some embodiments, command processor 104 can be configured to coordinate one or more cores 102 for parallel execution.

DMA unit 108 can assist with transferring data between host memory 122 and accelerator architecture 100. For example, DMA unit 108 can assist with loading data or instructions from host memory 122 into local memory of cores 102. DMA unit 108 can also assist with transferring data between multiple accelerators. DMA unit 108 can allow off-chip devices to access both on-chip and off-chip memory without causing a host CPU interrupt. In addition, DMA unit 108 can assist with transferring data between components of accelerator architecture 100. For example, DMA unit 108 can assist with transferring data between multiple cores 102 or within each core. Thus, DMA unit 108 can also generate memory addresses and initiate memory read or write cycles. DMA unit 108 also can contain several hardware registers that can be written and read by the one or more processors, including a memory address register, a byte-count register, one or more control registers, and other types of registers. These registers can specify some combination of the source, the destination, the direction of the transfer (reading from the input/output (I/O) device or writing to the I/O device), the size of the transfer unit, or the number of bytes to transfer in one burst. It is appreciated that accelerator architecture 100 can include a second DMA unit, which can be used to transfer data between other accelerator architectures to allow multiple accelerator architectures to communicate directly without involving the host CPU.

JTAG/TAP controller 110 can specify a dedicated debug port implementing a serial communications interface (e.g., a JTAG interface) for low-overhead access to the accelerator without requiring direct external access to the system address and data buses. JTAG/TAP controller 110 can also have on-chip test access interface (e.g., a TAP interface) that implements a protocol to access a set of test registers that present chip logic levels and device capabilities of various parts.

Peripheral interface 112 (such as a PCIe interface), if present, serves as an (and typically the) inter-chip bus, providing communication between the accelerator and other devices.

Bus 114 (such as a I$^2$C bus) includes both intra-chip bus and inter-chip buses. The intra-chip bus connects all internal components to one another as called for by the system architecture. While not all components are connected to every other component, all components do have some connection to other components they need to communicate with. The inter-chip bus connects the accelerator with other devices, such as the off-chip memory or peripherals. For example, bus 114 can provide high speed communication across cores and can also connect cores 102 with other units, such as the off-chip memory or peripherals. Typically, if there is a peripheral interface 112 (e.g., the inter-chip bus), bus 114 is solely concerned with intra-chip buses, though in some implementations it could still be concerned with specialized inter-bus communications.

Accelerator architecture 100 can also communicate with a host unit 120. Host unit 120 can be one or more processing unit (e.g., an X86 central processing unit). As shown in FIG. 1A, host unit 120 may be associated with host memory 122. In some embodiments, host memory 122 may be an integral memory or an external memory associated with host unit 120. In some embodiments, host memory 122 may comprise a host disk, which is an external memory configured to provide additional memory for host unit 120. Host memory 122 can be a double data rate synchronous dynamic random-access memory (e.g., DDR SDRAM) or the like. Host memory 122 can be configured to store a large amount of data with slower access speed, compared to the on-chip memory integrated within accelerator chip, acting as a higher-level cache. The data stored in host memory 122 may be transferred to accelerator architecture 100 to be used for executing neural network models.

In some embodiments, a host system having host unit 120 and host memory 122 can comprise a compiler (not shown). The compiler is a program or computer software that transforms computer codes written in one programming language into instructions for accelerator architecture 100 to create an executable program. In machine learning applications, a compiler can perform a variety of operations, for example, pre-processing, lexical analysis, parsing, semantic analysis, conversion of input programs to an intermediate representation, initialization of a neural network, code optimization, and code generation, or combinations thereof. For example, the compiler can compile a neural network to generate static parameters, e.g., connections among neurons and weights of the neurons.

In some embodiments, host system including the compiler may push one or more commands to accelerator architecture 100. As discussed above, these commands can be further processed by command processor 104 of accelerator architecture 100, temporarily stored in an instruction buffer of accelerator architecture 100, and distributed to corresponding one or more cores (e.g., cores 102 in FIG. 1A) or processing elements. Some of the commands may instruct a DMA unit (e.g., DMA unit 108 of FIG. 1A) to load instructions and data from host memory (e.g., host memory 122 of FIG. 1A) into accelerator architecture 100. The loaded instructions may then be distributed to each core (e.g., core 102 of FIG. 1A) assigned with the corresponding task, and the one or more cores may process these instructions.

Figure 1B:
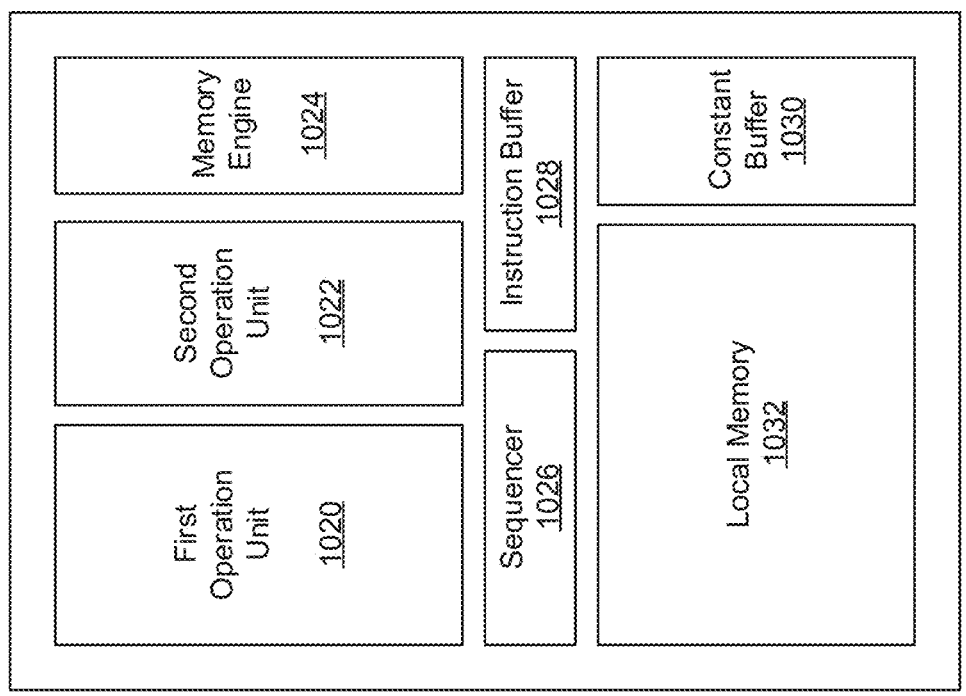
FIG. 1B illustrates an exemplary neural network accelerator core architecture, consistent with some embodiments of the present disclosure.

It is appreciated that the first few instructions received by the cores 102 may instruct the cores 102 to load/store data from host memory 122 into one or more local memories of the cores (e.g., local memory 1032 of FIG. 1B). Each core 102 may then initiate the instruction pipeline, which involves fetching the instruction (e.g., via a sequencer) from the instruction buffer, decoding the instruction (e.g., via a DMA unit 108 of FIG. 1A), generating local memory addresses (e.g., corresponding to an operand), reading the source data, executing or loading/storing operations, and then writing back results.

According to some embodiments, accelerator architecture 100 can further include a global memory (not shown) having memory blocks (e.g., 4 blocks of 8 GB second generation of high bandwidth memory (HBM2)) to serve as main memory. In some embodiments, the global memory can store instructions and data from host memory 122 via DMA unit 108. The instructions can then be distributed to an instruction buffer of each core assigned with the corresponding task, and the core can process these instructions accordingly.

In some embodiments, accelerator architecture 100 can further include memory controller (not shown) configured to manage reading and writing of data to and from a specific memory block (e.g., HBM2) within global memory. For example, memory controller can manage read/write data coming from core of another accelerator (e.g., from DMA unit 108 or a DMA unit corresponding to the another accelerator) or from core 102 (e.g., from a local memory in core 102). It is appreciated that more than one memory controller can be provided in accelerator architecture 100. For example, there can be one memory controller for each memory block (e.g., HBM2) within global memory.

Memory controller can generate memory addresses and initiate memory read or write cycles. Memory controller can contain several hardware registers that can be written and read by the one or more processors. The registers can include a memory address register, a byte-count register, one or more control registers, and other types of registers. These registers can specify some combination of the source, the destination, the direction of the transfer (reading from the input/output (I/O) device or writing to the I/O device), the size of the transfer unit, the number of bytes to transfer in one burst, or other typical features of memory controllers.

While accelerator architecture 100 of FIG. 1A can be used for convolutional neural networks (CNNs) in some embodiments of the present disclosure, it is appreciated that accelerator architecture 100 of FIG. 1A can be utilized in various neural networks, such as deep neural networks (DNNs), recurrent neural networks (RNNs), or the like. In addition, some embodiments can be configured for various processing architectures, such as neural network processing units (NPUs), graphics processing units (GPUs), field programmable gate arrays (FPGAs), tensor processing units (TPUs), application-specific integrated circuits (ASICs), any other types of heterogeneous accelerator processing units (HAPUs), or the like FIG. 1B illustrates an exemplary core architecture, consistent with embodiments of the present disclosure. As shown in FIG. 1B, core 102 can include one or more operation units such as first and second operation units 1020 and 1022, a memory engine 1024, a sequencer 1026, an instruction buffer 1028, a constant buffer 1030, a local memory 1032, or the like.

One or more operation units can include first operation unit 1020 and second operation unit 1022. First operation unit 1020 can be configured to perform operations on received data (e.g., matrices). In some embodiments, first operation unit 1020 can include one or more processing units configured to perform one or more operations (e.g., multiplication, addition, multiply-accumulate, element-wise operation, etc.). In some embodiments, first operation unit 1020 is configured to accelerate execution of convolution operations or matrix multiplication operations.

Second operation unit 1022 can be configured to perform a pooling operation, an interpolation operation, a region-of-interest (ROI) operation, and the like. In some embodiments, second operation unit 1022 can include an interpolation unit, a pooling data path, and the like.

Memory engine 1024 can be configured to perform a data copy within a corresponding core 102 or between two cores. DMA unit 108 can assist with copying data within a corresponding core or between two cores. For example, DMA unit 108 can support memory engine 1024 to perform data copy from a local memory (e.g., local memory 1032 of FIG. 1B) into a corresponding operation unit. Memory engine 1024 can also be configured to perform matrix transposition to make the matrix suitable to be used in the operation unit.

Sequencer 1026 can be coupled with instruction buffer 1028 and configured to retrieve commands and distribute the commands to components of core 102. For example, sequencer 1026 can distribute convolution commands or multiplication commands to first operation unit 1020, distribute pooling commands to second operation unit 1022, or distribute data copy commands to memory engine 1024. Sequencer 1026 can also be configured to monitor execution of a neural network task and parallelize sub-tasks of the neural network task to improve efficiency of the execution. In some embodiments, first operation unit 1020, second operation unit 1022, and memory engine 1024 can run in parallel under control of sequencer 1026 according to instructions stored in instruction buffer 1028.

Instruction buffer 1028 can be configured to store instructions belonging to the corresponding core 102. In some embodiments, instruction buffer 1028 is coupled with sequencer 1026 and provides instructions to the sequencer 1026. In some embodiments, instructions stored in instruction buffer 1028 can be transferred or modified by command processor 104.

Constant buffer 1030 can be configured to store constant values. In some embodiments, constant values stored in constant buffer 1030 can be used by operation units such as first operation unit 1020 or second operation unit 1022 for batch normalization, quantization, de-quantization, or the like.

Local memory 1032 can provide storage space with fast read/write speed. To reduce possible interaction with a global memory, storage space of local memory 1032 can be implemented with large capacity. With the massive storage space, most of data access can be performed within core 102 with reduced latency caused by data access. In some embodiments, to minimize data loading latency and energy consumption, SRAM (static random access memory) integrated on chip can be used as local memory 1032. In some embodiments, local memory 1032 can have a capacity of 192 MB or above. According to some embodiments of the present disclosure, local memory 1032 be evenly distributed on chip to relieve dense wiring and heating issues.

Figure 2:
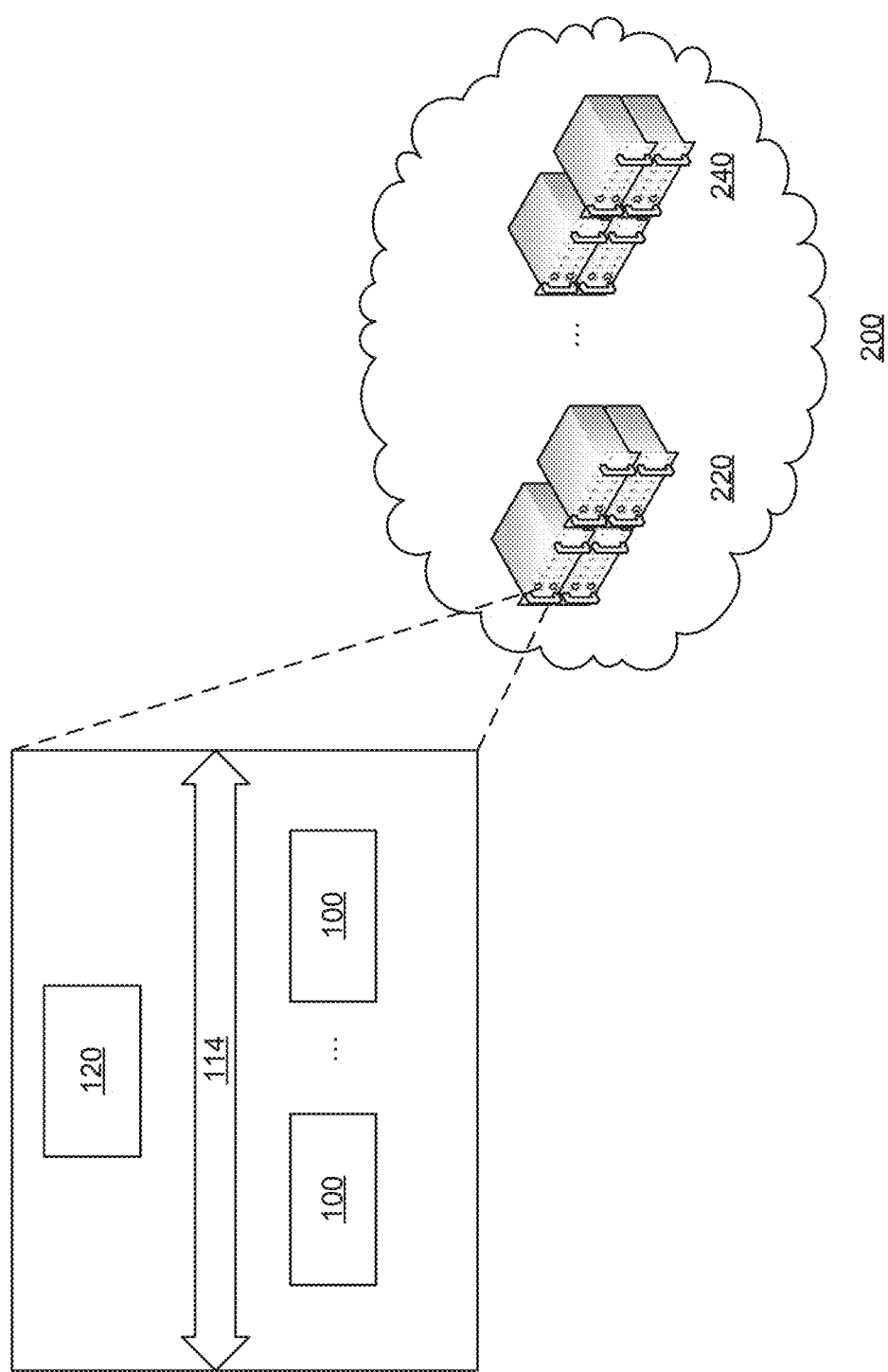
FIG. 2 illustrates a schematic diagram of an exemplary cloud system incorporating a neural network accelerator, consistent with some embodiments of the present disclosure.

FIG. 2 illustrates a schematic diagram of an exemplary cloud system 200 incorporating accelerator architecture 100, consistent with embodiments of the present disclosure. As shown in FIG. 2, cloud system 200 can provide a cloud service with artificial intelligence (AI) capabilities and can include a plurality of computing servers (e.g., 220 and 240). In some embodiments, a computing server 220 can, for example, incorporate a neural network accelerator architecture 100 of FIG. 1A. Neural network accelerator architecture 100 is shown in FIG. 2 in a simplified manner for simplicity and clarity.

With the assistance of neural network accelerator architecture 100, cloud system 200 can provide the extended AI capabilities of image recognition, facial recognition, translations, 3D modeling, and the like. It is appreciated that, neural network accelerator architecture 100 can be deployed to computing devices in other forms. For example, neural network accelerator architecture 100 can also be integrated in a computing device, such as a smart phone, a tablet, and a wearable device.

Figure 3:
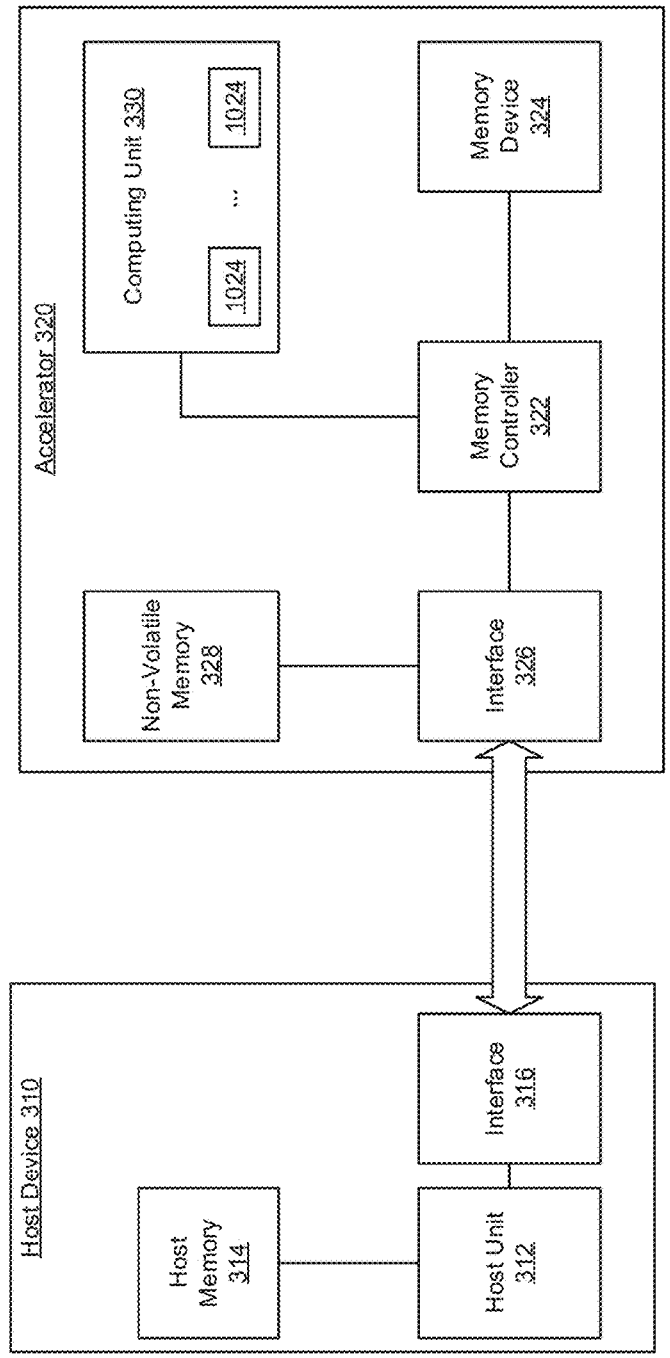
FIG. 3 is a schematic diagram illustrating an exemplary processing system, consistent with some embodiments of the present disclosure.

FIG. 3 is a schematic diagram illustrating an exemplary processing system 300, consistent with some embodiments of the present disclosure. Processing system 300 may apply the same or similar architecture of neural network computing architecture 100 shown in FIG. 1A and include a host device 310 and an accelerator 320 communicatively coupled to host device 310. Host device 310 includes a host unit (e.g., a central processing unit (CPU)) 312, a host memory 314 associated with host unit 312, and a host interface 316. Accelerator 320 includes a memory controller 322, a memory device 324 associated with memory controller 322, an accelerator interface 326, a non-volatile memory 328 and a computing unit 330 associated with memory controller 322 and including cores 102. In some embodiment, memory controller 322 can be a customized controller to support the proposed method for refreshing memory in the embodiments of the present disclosure.

As illustrated in FIG. 3, host device 310 and accelerator 320 can be communicatively coupled through a peripheral interface (e.g., host interface 316 and accelerator interface 326) and transmit commands, instructions, or data to each other through the peripheral interface. For example, host interface 316 and accelerator interface 326 can be Peripheral Component Interconnect Express (PCI Express), but the present disclosure is not limited thereto.

Host device 310 can receive commands from client devices or programmers to perform several tasks. For example, a user can operate a software program or application on a virtual machine (VM) running on host device 310, and the command may include a coarse-grained instruction which can be decoded and executed by computing unit 330 in accelerator 320.

As shown in FIG. 3, memory controller 322, memory device 324, and computing unit 330 in accelerator 320 are integrated on the same chip or the same die or embedded in the same package. Accelerator 320 can be a general hardware configured to receive or load commands or instructions from host device 310 through host interface 316 and accelerator interface 326. In some embodiments, user commands from host device 310 are written into one or more physical command buffers in accelerator 320 and stored in corresponding physical queues in accelerator 320. Then, the commands can be scheduled by one or more task managers in accelerator 320 and dispatched to one or more cores 102 in computing unit 330 for execution.

When executing the commands, the software stored and run on host device 310 can write or read data from memory device 324 through memory controller 322. For example, memory device 324 may be the global memory in accelerator 320, or other memory device(s) in task manager, but the present disclosure is not limited thereto.

In some embodiments, accelerator 320 may be a DRAM-based or an eDRAM-based accelerator, in which memory device 324 is a DRAM or an eDRAM having a memory array including memory cells arranged in rows and columns. In addition, the memory array in memory device 324 may be divided into multiple partitions, also called "trunks" for storing data. Each trunk includes one or more rows of the memory array. As discussed above, memory cells storing information need to be refreshed or accessed at least once within its retention time to avoid erroneous readout. The retention time may decrease with increasing temperature. Accordingly, a maximum time interval between two adjacent refresh operations for the same memory cell in memory device 324 is called a refresh window (tREFW), which is usually specified in the manufacturer's chip specifications. For example, the refresh window may be either 32 milliseconds (ms) or 64 ms.

Non-volatile memory 328 can be configured to store the information of memory device 324. For example, the information stored in non-volatile memory 328 may include information such as a capacity of memory device 324, a row size of memory device 324, the refresh window of memory device 324, a trunk size of memory device 324, and the like.

During the operations, host device 310 can access non-volatile memory 328 to obtain the information of memory device 324 to perform the refresh operations.

More particularly, the refresh operations, which involves reading and restoring data in memory cells of the memory array, can be managed by memory controller 322 in accelerator 320, or by the software stored in host memory 314 and executed by host unit 312. That is, both host device 310 and accelerator 320 are capable of performing the refresh operation. For example, when memory controller 322 is configured to manage the refresh operations, memory controller 322 may issue auto-refresh commands at a rate to refresh a number of rows in the memory array of memory device 324. On the other hand, when host device 310 is configured to manage the refresh operation, host unit 312 can execute software codes stored in host memory 314 to obtain relevant information such as the capacity, the row size, and the refresh window of memory device 324, and issue corresponding commands to access targeted memory cells in the memory array of memory device 324 to achieve refreshing. In addition, in some embodiments, in a self-refresh mode, memory device 324 can be configured to generate pulse signals using an internal built-in timer to achieve refreshing without external signals.

As referred to herein, computing unit 330 may include one or more NPUs including control and arithmetic logic components for executing machine learning algorithms. In some embodiments, the NPU may be configured to accelerate neural network computing tasks and be used as a co-processor of host unit 312. In neural network computation, lifetime and access time of some data are deterministic in a certain range. Particularly, the lifetime and access pattern of some data may relate to characteristic of algorithms used in the application. For example, in some embodiments, the lifetime of feature maps of a convolutional neural network (CNN) is around 0.15 ms in inference and at most around 55 ms during training. The weights of the CNN model are accessed every 7 ms in inference and accessed every around 55 ms during training. It is appreciated that the lifetime and accessed time provided herein are merely examples and not meant to limit the present disclosure. When performing memory refresh, host device 310 can determine whether to refresh a row based on the data stored in the row and its lifetime information and access time information and guarantee all live data are read, write, or activated within the refresh window.

Host device 310 can control accelerator 320 to be operated in different memory refresh modes by sending corresponding commands to enable or disable one or more refresh operations of memory controller 322. More particularly, host device 310 selects between different memory refresh modes of operations of accelerator 320. For further understanding of different memory refresh modes, the refresh operations in each refresh mode will be discussed in detail below with accompanying drawings.

Reference is made to FIG. 4A. FIG. 4A is a schematic diagram illustrating the structure of an exemplary mapping table 400a stored in host memory 314 and maintained by host device 310 in a direct refresh mode, consistent with some embodiments of the present disclosure. When accelerator 320 is configured to operate in the direct refresh mode, host device 310 is configured to disable refresh operations including auto refresh and self refresh of memory controller 322 mentioned above and to refresh one or more rows of the memory array containing data based on refresh information stored in mapping table 400a. As shown in FIG. 4A, mapping table 400a includes multiple entries ENTRY1, ENTRY2 . . . , and ENTRYn. Each entry includes a refresh tag 410 and a row field 420. It is appreciated that in some embodiments, mapping table 400a can include more or less fields than those shown in FIG. 4A.

Respective refresh tags 410 are assigned for corresponding rows of the memory array. Each refresh tag 410 stores a value indicating whether the corresponding row in the memory array is refreshed or accessed in the current refresh cycle. Each row field 420 stores the row information, such as a reference memory address, of the corresponding row. When a refresh cycle starts, refresh tags 410 for entries ENTRY1-ENTRYn are set to a first value (e.g., value of "0"), which indicates that the corresponding row is not yet accessed or refreshed in the current refresh cycle. When a read or write operation is applied to one of the rows of the memory array, the refresh tag 410 in the corresponding one of entries ENTRY1-ENTRYn is set to a second value (e.g., value of "1"), which indicates that the corresponding row is accessed or refreshed in the current refresh cycle.

Accordingly, mapping table 400a are maintained by host device 310 dynamically in each cycle, and host device 310 is configured to send refresh commands, periodically or intermittently, with corresponding rows with refresh tags set to the first value (e.g., value of "0") to refresh the rows of the memory array. That is, host device 310 may skip the refresh operation to a row if the corresponding refresh tag 410 is set to the second value before the refresh operation is performed.

In some embodiments, the mapping table can be predefined and maintained statically. Reference is made to FIG. 4B. FIG. 4B is a schematic diagram illustrating the structure of an exemplary mapping table 400b which is statically maintained in the direct refresh mode, consistent with some embodiments of the present disclosure. Compared to mapping table 400a shown in FIG. 4A, in the embodiments of FIG. 4B, entries ENTRY1-ENTRYn include corresponding row fields 420 storing the row information of the corresponding rows. Each one of entries ENTRY1-ENTRYn indicates a row in the memory array that contains data with a lifetime value greater than a refresh window (tREFW) value. Host device 310 then refreshes the memory array according to mapping table 400b in the refresh cycle. More particularly, host device 310 can send refresh commands to refresh the corresponding rows for entries ENTRY1-ENTRYn. That is, if a row only stores data with the lifetime value less than the refresh window value, the row information is not stored in mapping table 400b and thus host device 310 will not send a refresh command to perform a refresh operation. For example, for neural networks inference application with latency less than the refresh window value, only the weights need to be refreshed.

Figures 5, 6A, 6B:
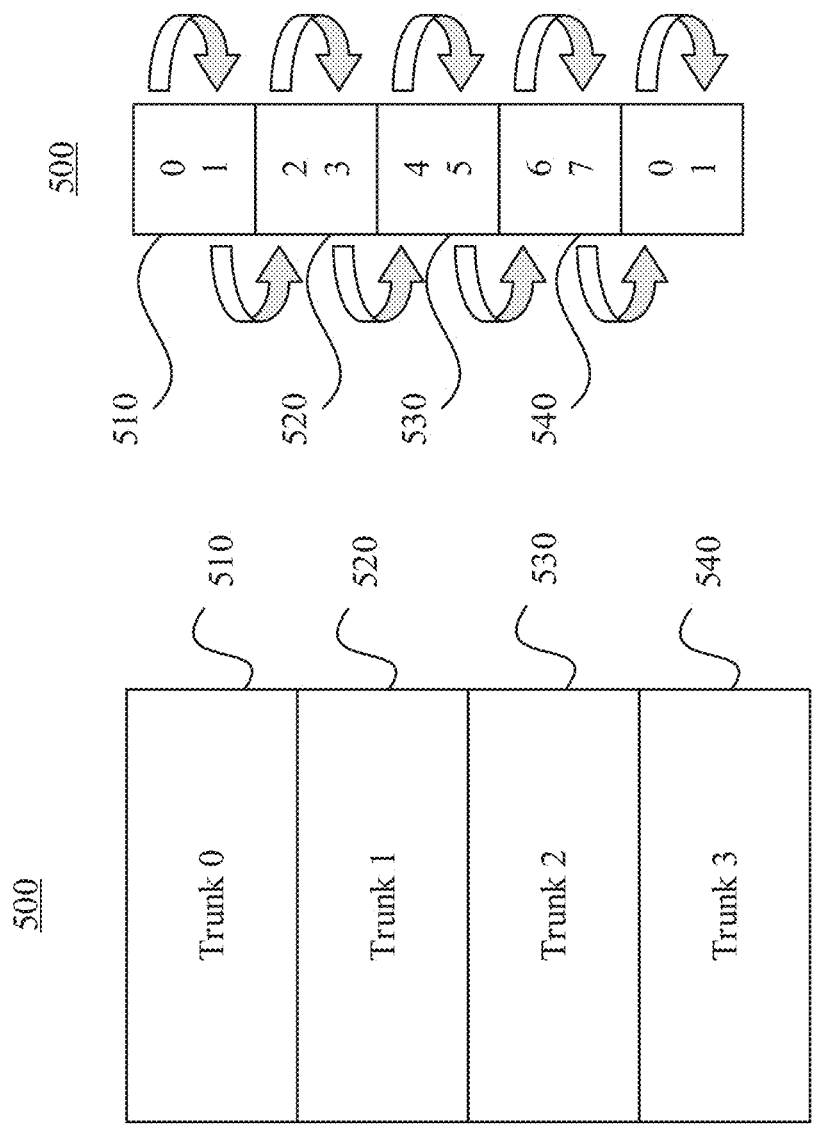
FIG. 5 is a schematic diagram illustrating the structure of a memory array, consistent with some embodiments of the present disclosure.
FIG. 6A and FIG. 6B are diagrams illustrating operations of a refresh counter and bypass logic, consistent with some embodiments of the present disclosure.

Reference is made to FIG. 5. FIG. 5 is a schematic diagram illustrating the structure of a memory array 500 in a partial refresh mode, consistent with some embodiments of the present disclosure. In the partial refresh mode, host device 310 is configured to enable refresh operations, such as auto refresh or self refresh, of memory controller 322 mentioned above and to configure memory controller 322 to refresh one or more partitions of the memory array containing data. As shown in FIG. 5, memory array 500 includes multiple partitions 510, 520, 530, and 540. Partitions 510-540 also known as "trunks" of memory array 500.

When accelerator 320 is configured to operate in the partial refresh mode, host device 310 allocates data in multiple partitions 510, 520, 530, and 540 based on a lifetime value of the data. More particularly, host device 310 can allocate live data with similar lifetime values into the same partitions, and identify the type of partitions 510, 520, 530, and 540. For example, partitions 510, 520, 530, and 540 can be classified into three different types: a first type partition that contains data with the lifetime value greater than the refresh window value and thus needs to be refreshed, a second type partition that contains data with the lifetime value less than the refresh window value, and a third type partition that does not contain data.

Host device 310 can identify one or more partitions storing data with the lifetime value greater than the refresh window value as one or more active regions to be refreshed by memory controller 322 and provide information of the active region(s) to memory controller 322. Based on the information of the active region(s), bypass logic in a refresh counter of memory controller 322 is applied to bypass the memory address for one or more partitions 510, 520, 530, and 540 that are identified as the second type partition or the third type partition. Thus, memory controller 322 can perform auto-refresh or self-refresh with the memory address generated from the refresh counter and bypass logic, so that memory controller 322 can perform the refresh operations accordingly.

FIG. 6A and FIG. 6B are diagrams illustrating operations of the refresh counter and bypass logic in a partial refresh mode, consistent with some embodiments of the present disclosure. In some embodiments, memory controller 322 may perform refresh operation based on a refresh counter in memory controller 322. Refresh counter values correspond to the memory addresses of respective rows to be refreshed in memory array 500. For example, refresh counter values of "0" and "1" correspond to the memory addresses of two rows in partition 510, refresh counter values of "2" and "3" correspond to the memory addresses of two rows in partition 520, refresh counter values of "4" and "5" correspond to the memory addresses of two rows in partition 530, and refresh counter values of "6" and "7" correspond to the memory addresses of two rows in partition 540. As shown in FIG. 6A, if partitions 510, 520, 530, and 540 all contain data with the lifetime value greater than the refresh window value, the refresh counter counts repeatedly from 0 to 7, without bypassing any one of partitions 510, 520, 530, and 540, and memory controller 322 performs auto-refresh or self-refresh with the memory addresses corresponding to partitions 510-540.

On the other hand, as shown in FIG. 6B, if partition 520 is identified as the second type partition or the third type partition that does not contain any data, the refresh counter bypasses the refresh counter values of "2" and "3" corresponding to partition 520. Accordingly, memory controller 322 performs auto-refresh or self-refresh with the memory addresses corresponding to partitions 510, 530 and 540, while partition 520 is not refreshed.

In some embodiments, host device 310 is configured to calculate a refresh interval parameter for refreshing based on a total number of partitions 510-540 in memory array 500 and the number of identified active region(s). The refresh interval parameter is used to determine the average period of refresh interval for a memory device. The equation for calculating the refresh interval parameter can be based on the following:

$$tREFI_{new} = tREFI \cdot \frac{\text{Total Number of Partitions}}{\text{Number of Active Regions}}$$

In the above equation, tREFI indicates the refresh interval when all partitions need to be refreshed, and $tREFI_{new}$ indicates the calculated refresh interval when one or more partitions are bypassed. If the number of rows need to be refreshed is reduced, the refresh interval parameter is increased as less refresh operations are performed in one refresh cycle.

Host device 310 can update the information of partitions 510-540 and the information of the active region(s) in each refresh cycle. For example, the total number of partitions may change over time, and data stored in these partitions 510-540 and its lifetime may also change over time. Accordingly, in some embodiments, host device 310 is configured to update the total number of partitions and the number of the active region(s) at an end of the refresh cycle. Then, memory controller 322 is configured to calculate the refresh interval parameter $tREFI_{new}$ for a next refresh cycle based on the updated total number of the partitions and the updated number of the active region(s), so as to adjust the refresh interval parameter $tREFI_{new}$ accordingly. Since the switching of the type of the partitions occurs at the end of the refresh cycle, the switching does not result in timing violation.

While four partitions are illustrated in FIG. 5, FIG. 6A and FIG. 6B, it is appreciated that in different embodiments, numbers of partitions, the size of each partition, and the range of the refresh counter can be modified based on actual requirements. The embodiments shown in FIG. 5, FIG. 6A and FIG. 6B are merely examples and not meant to limit the present disclosure.

In some embodiments, host device 310 can further configure accelerator 320 to operate in a hybrid refresh mode, such that the memory refreshing is performed by cooperation of host device 310 and accelerator 320. Similar to the operations in the partial refresh mode, when accelerator 320 is configured to operate in the hybrid refresh mode, host device 310 also allocates data in multiple partitions 510, 520, 530, and 540 and identifies the type of partitions 510, 520, 530, and 540. Memory controller 322 is configured to refresh one or more first partitions identified by host device 310 in each refresh cycle by performing auto-refresh or self-refresh with the memory address generated from the refresh counter and bypass logic.

For one or more second partitions of which memory controller 322 does not perform refresh operations, host device 310 can access or refresh the data within every refresh window, if the lifetime of the data is greater than the refresh window. That is, second partition(s) can be used to store not only data with the lifetime value less than the refresh window, but also data that is accessed or refreshed by host device 310. In some embodiments, host device 310 does not have to necessarily refresh all rows in the second partition(s). Host device 310 can generate a mapping table (e.g., mapping table 400a or 400b in FIG. 4A and FIG. 4B) for second partition(s) and refresh the rows that contain data and need to be refreshed based on the mapping table. The refresh operations may be omitted for one or more third partitions, since no live data is stored in third partition(s) of the memory array.

In some embodiments, the hybrid refresh mode gives extra flexibilities to allocate data in the memory array. For example, compared to the partial refresh mode, the number of partitions refreshed by memory controller 322 can be reduced in the hybrid refresh mode. Furthermore, host device 310 can also update the information of partitions and the information of first partition(s) and second partition(s) in each refresh cycle. For example, if a number or a ratio of rows that need to be refreshed in a second partition exceeds a threshold value, host device 310 can update the information to relieve from the refresh responsibility by identifying the partition to be the first partition in the next refresh cycle. Thus, starting from the next cycle, memory controller 322 can take over the refresh operations. On the other hand, if a number or a ratio of rows that need to be refreshed in a first partition is under another threshold value, host device 310 can update the information to take over the refresh responsibility from memory controller 322 by identifying the partition to be the second partition in the next refresh cycle. Thus, starting from the next cycle, only specific rows in this partition will be refreshed by host device 310. Thus, host device 310 can optimize the resource by determining which partition(s) are refreshed by memory controller 322, which partition(s) are refreshed by host device 310, and which partition(s) are not refreshed.

In some embodiments, host device 310 can further switch the refresh mode by transmitting a mode switching command to switch between the direct refresh mode, the partial refresh mode, and the hybrid refresh mode on the fly. To avoid timing violation or conflict, memory controller 322 in accelerator 320 is configured to switch between different refresh modes when the refresh cycle ends in response to the mode switching command is received from host device 310.

In the direct refresh mode, the partial refresh mode, or the hybrid refresh mode, the proposed memory refresh method can reduce the refresh overhead of DRAM by taking characteristics of algorithms used in the application, data allocation in the memory array, and lifetime of data into consideration. In addition, the proposed memory refresh method can provide a practical refresh optimization to reduce the refresh penalty with increasing size of DRAM, such as the energy consumption, instruction per cycle (IPC) penalty and memory access latency due to the refresh.

Figure 7:
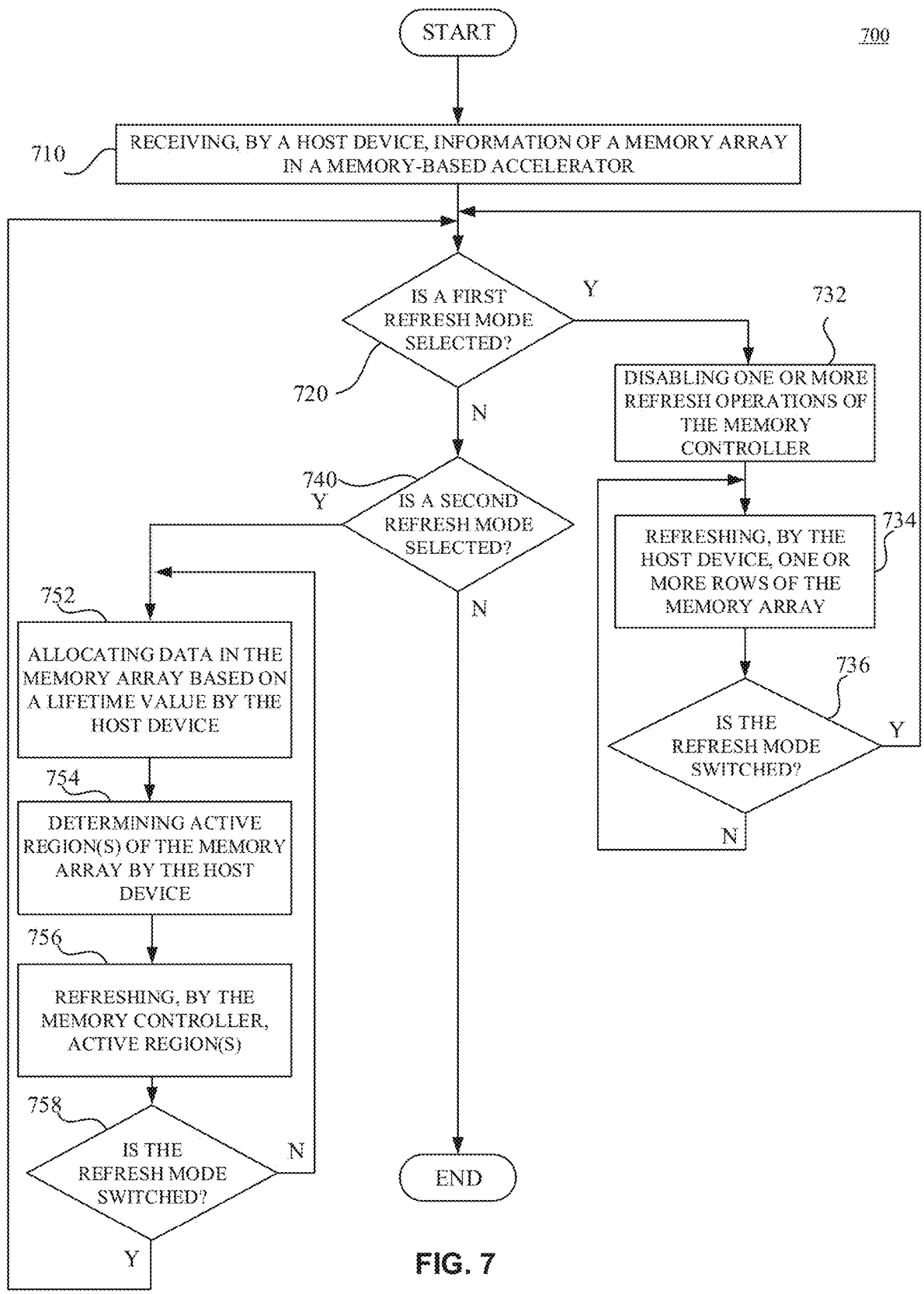
FIG. 7 and FIG. 8 are flow diagrams of exemplary methods for refreshing memory, consistent with some embodiments of the present disclosure.

FIG. 7 is a flow diagram of an exemplary method 700 for refreshing memory, consistent with some embodiments of the present disclosure. For example, method 700 can be performed or implemented by software stored in a host device (e.g., host device 310 having host unit 312 and host memory 314 in FIG. 3) communicatively coupled to an accelerator (e.g., accelerator 320 in FIG. 3). As shown in FIG. 7, in some embodiments, method 700 includes steps 710-758, which will be discussed in the following paragraphs.

In step 710, the host device (e.g., host device 310 in FIG. 3) receives information of a memory array in an accelerator (e.g., accelerator 320 in FIG. 3). For example, the host device may receive relevant information such as the capacity, the row size and the refresh window of the memory device (e.g., memory device 324 in FIG. 3).

By performing step 720 and step 740, the host device selects between a first refresh mode (e.g., a direct refresh mode) and a second refresh mode (e.g., a partial refresh mode) of operation of the accelerator.

Particularly, in step 720, the host device determines whether the first refresh mode is selected. If the first refresh mode is selected (step 720—yes), the host device performs steps 732, 734, and 736 to operate the accelerator in the first refresh mode. For example, the host device can write corresponding information to memory controller 322 to set the first refresh mode and configure parameters required in the first refresh mode.

In step 732, the host device disables one or more refresh operations of a memory controller (e.g., memory controller 322 in FIG. 3).

In step 734, the host device refreshes one or more rows of the memory array based on the received information. For example, host device may record row(s) containing data with the lifetime value greater than the refresh window value in a mapping table, which can be generated and maintained statically or dynamically in different embodiments. Then, in one refresh cycle, host device can access the row(s) to refresh the memory array according to the mapping table. If the mapping table is dynamically maintained, respective refresh tags in the mapping table are assigned for the rows of the memory array. When a new refresh cycle starts, refresh tags are reset to a first value, indicating that the rows need to be refreshed. When a read or write operation is applied to a row within the refresh cycle, host device sets the corresponding refresh tag to a second value, indicating that the row is accessed in this refresh cycle. Thus, host device can refresh the row(s) of the memory array with the corresponding refresh tag(s) being set to the first value.

In step 736, the host device determines whether the refresh mode is switched. If the refresh mode is not switched (step 736—no), the host device repeats steps 734 and 736 until the refresh mode is switched. When the refresh mode is switched (step 736—yes), the host device repeats step 720. Thus, the refresh mode can be switched from the first refresh mode to the second refresh mode on the fly without causing errors or time violation.

On the other hand, if the first refresh mode is not selected (step 720—no), in step 740, the host device determines whether the second refresh mode is selected. If the second refresh mode is selected (step 740—yes), the host device performs steps 752, 754, 756 and 758 to operate the accelerator in the second refresh mode and configures the memory controller to refresh one or more active regions of the memory array. For example, the host device can determine the one or more active regions that are to be refreshed and write corresponding information to memory controller 322 to set the second refresh mode and information to locate the active region(s). Thus, memory controller 322 can be configured to refresh the row(s) containing live data.

Particularly, in step 752, the host device allocates data in partitions of the memory array based on a lifetime value of the data. Since the host device can determine, in a certain range, the lifetime or access pattern of data based on algorithms used in the application, data with similar lifetime values can be stored into the same partition if possible.

In step 754, the host device identifies partition(s) storing data with the lifetime value greater than a refresh window value as the active region(s) to be refreshed by the memory controller.

In step 756, the host device configures the memory controller to refresh the one or more active regions. When configuring the memory controller, the host device can determine the refresh interval parameter for refreshing based on the total number of the partitions and the number of the active region(s), and provide the refresh interval parameter, and information of the active region(s) to the memory controller. In some embodiments, the host device can update the information mentioned above at the end of the refresh cycle and calculate the parameter to be applied in the next refresh cycle based on the updated total number of the partitions and the updated number of the active region(s).

In step 758, the host device determines whether the refresh mode is switched. If the refresh mode is not switched (step 758—no), the host device repeats steps 752-758 until the refresh mode is switched. When the refresh mode is switched (step 758—yes), the host device repeats step 720. Thus, the refresh mode can be switched from the second refresh mode to the first refresh mode on the fly without causing errors or time violation.

Figure 8:
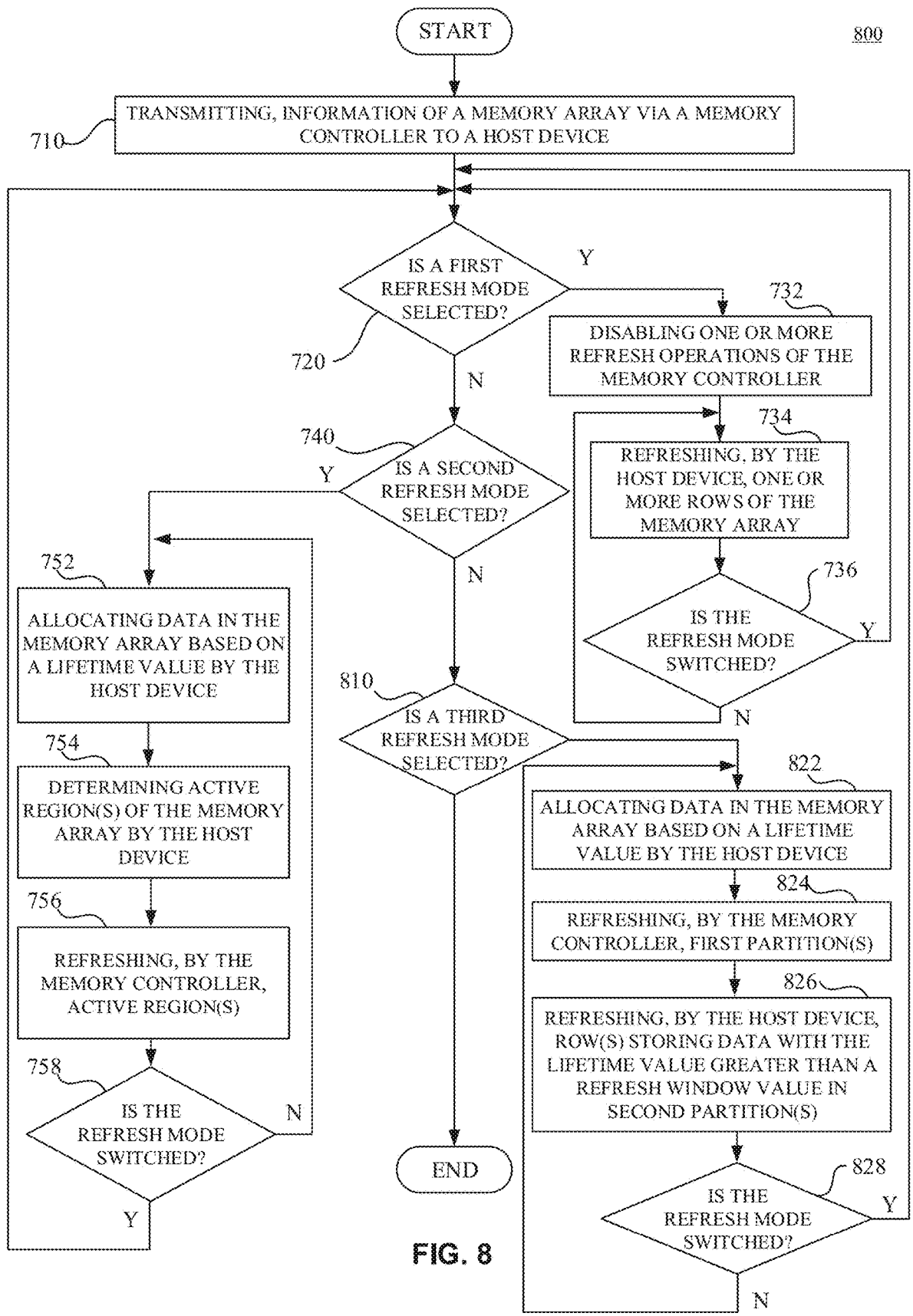

FIG. 8 is a flow diagram of an exemplary method 800 for refreshing memory, consistent with some embodiments of the present disclosure. Similar to method 700 in FIG. 7, method 800 can also be performed or implemented by software stored in a host device (e.g., host device 310 having host unit 312 and host memory 314 in FIG. 3) coupled to an accelerator (e.g., accelerator 320 in FIG. 3). As shown in FIG. 8, in addition to steps 710-758, method 800 further includes steps 810 and 822-828 to configure the memory controller to operate the accelerator in a third refresh mode, which may be a hybrid refresh mode combining the first and the second refresh modes discussed above.

Particularly, if both the first refresh mode and the second refresh mode are not selected (step 740—no), the host device performs step 810 and determines whether the third refresh mode (e.g., hybrid refresh mode) is selected.

If the third refresh mode is selected (step 810—yes), the host device performs steps 822, 824, 826 and 828 to operate the accelerator in the third refresh mode. In the third refresh mode, the memory controller is configured to refresh one or more first partitions in each refresh cycle, and the host device is configured to access or refresh row(s) storing data with the lifetime value greater than the refresh window value in one or more second partitions.

Particularly, in step 822, the host device allocates data in partitions of the memory array based on a lifetime value of the data. Detail operations of the allocation are similar to the operations in step 752 discussed above, and thus are not repeated herein for the sake of brevity.

In step 824, the host device configures the memory controller to refresh one or more first partitions of the partitions in the memory array. Detail operations of the refresh operations performed by the memory controller are similar to the operations in steps 754 and 756 discussed above, and thus are not repeated herein for the sake of brevity.

In step 826, the host device accesses or refreshes one or more rows storing data with the lifetime value greater than the refresh window value in one or more second partitions of the partitions. Detail operations of the refresh operations performed by the host device are similar to the operations in step 734 discussed above, and thus are not repeated herein for the sake of brevity.

In step 828, the host device determines whether the refresh mode is switched. If the refresh mode is not switched (step 828—no), the host device repeats steps 822-828 until the refresh mode is switched. When the refresh mode is switched (step 828—yes), the host device repeats step 720. Thus, host device can select between the first refresh mode, the second refresh mode and the third refresh mode of operation of the accelerator on the fly without causing errors or time violation.

Therefore, as discussed in the above operations in methods 700 and 800 in FIG. 7 and FIG. 8, by selecting the accelerator to be operated in different modes, the user can adjust or tune the refresh operations to fit different needs in different applications. For example, the direct refresh mode may provide a fine granularity, where the host device separately determines whether to perform refresh on each row in the memory array. On the other hand, the partial refresh mode may provide a coarse granularity, where the host device determines whether to perform refresh on each partition corresponding to multiple rows in the memory array.

Further, in some embodiments, the hybrid refresh mode can adopt different approaches for refreshing based on the data characteristic stored in the partitions, to provide partition-wise refresh for some partitions and row-wise refresh for other partitions and give more flexibilities in data allocation in the memory array.

In view of above, as proposed in various embodiments of the present disclosure, the proposed devices and methods for refreshing memory provide a practical refresh optimization to solve, or at least relieve, the problems of significant refresh overhead and penalty due to the refresh with increasing size of DRAM, including the energy consumption, instruction per cycle (IPC) penalty and memory access latency. The overall refresh overhead of DRAM can be reduced by using a customized memory controller and determining which part of the system handles the refresh operations, and which partition(s) or row(s) in the memory array should be refreshed according to the algorithms in the application, and the data lifetime and the data allocation in the memory array.

Embodiments of the present disclosure can be applied to many products, environments, and scenarios. For example, some embodiments of the present disclosure can be applied to Processor-in Memory (PIM), such as Processor-in Memory for AI (PIM-AI), that includes DRAM based processing unit. Some embodiments of the present disclosure can also be applied to Tensor Processing Unit (TPU), Data Processing Unit (DPU), Neural network Processing Unit (NPU), or the like.

Embodiments of the disclosure also provide a computer program product. The computer program product may include a non-transitory computer readable storage medium having computer readable program instructions thereon for causing a processor to carry out the above-described methods.

The computer readable storage medium may be a tangible device that can store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

The computer readable program instructions for carrying out the above-described methods may be assembler instructions, instruction-set-architecture (ISA) instructions, machine instructions, machine dependent instructions, microcode, firmware instructions, state-setting data, or source code or object code written in any combination of one or more programming languages, including an object-oriented programming language, and conventional procedural programming languages. The computer readable program instructions may execute entirely on a computer system as a stand-alone software package, or partly on a first computer and partly on a second computer remote from the first computer. In the latter scenario, the second, remote computer may be connected to the first computer through any type of network, including a local area network (LAN) or a wide area network (WAN).

The computer readable program instructions may be provided to a processor of a computer, or other programmable data processing apparatus to produce a machine, such that the instructions, which execute via the processor of the computer or other programmable data processing apparatus, create means for implementing the above-described methods.

The flow charts and diagrams in the figures illustrate the architecture, functionality, and operation of possible implementations of devices, methods, and computer program products according to various embodiments of the specification. In this regard, a block in the flow charts or diagrams may represent a software program, segment, or portion of code, which includes one or more executable instructions for implementing specific functions. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the diagrams or flow charts, and combinations of blocks in the diagrams and flow charts, may be implemented by special purpose hardware-based systems that perform the specified functions or acts, or combinations of special purpose hardware and computer instructions.

It is appreciated that certain features of the specification, which are, for clarity, described in the context of separate embodiments, may also be provided in combination in a single embodiment. Conversely, various features of the specification, which are, for brevity, described in the context of a single embodiment, may also be provided separately or in any suitable subcombination or as suitable in any other described embodiment of the specification. Certain features described in the context of various embodiments are not to be considered essential features of those embodiments, unless the embodiment is inoperative without those elements.

The embodiments may further be described using the following clauses:

1. A method for refreshing memory, comprising:
receiving information of a memory array in an accelerator coupled to a host device;
when the accelerator operates in a first refresh mode, based on the received information:
disabling one or more refresh operations of a memory controller; and
refreshing one or more rows of the memory array by the host device.

2. The method for refreshing memory of clause 1, further comprising:
when the accelerator operates in the first refresh mode:
generating a mapping table recording the one or more rows to be refreshed, wherein the one or more rows to be refreshed contain data with a lifetime value greater than a refresh window value; and
refreshing the memory array according to the mapping table.

3. The method for refreshing memory of clause 1 or clause 2, further comprising:
when the accelerator operates in the first refresh mode:
assigning respective refresh tags for a plurality of rows of the memory array;
setting the refresh tags to a first value when a refresh cycle starts;
setting the corresponding refresh tag to a second value when a read or write operation is applied to one of the plurality of rows of the memory array; and
refreshing the one or more rows of the memory array with the corresponding one or more refresh tags being set to the first value.

4. The method for refreshing memory of clause 1, further comprising:
selecting between a plurality of refresh modes of operation of the accelerator, wherein the plurality of refresh modes comprises the first refresh mode and a second refresh mode, wherein:
when the accelerator operates in the second refresh mode:
determining one or more active regions of the memory array, and
configuring the memory controller to refresh the one or more active regions.

5. The method for refreshing memory of clause 4, further comprising:
when the accelerator operates in the second refresh mode:
allocating data in a plurality of partitions of the memory array based on a lifetime value of the data;
identifying one or more partitions storing data with a lifetime value greater than a refresh window value as the one or more active regions to be refreshed by the memory controller; and
providing information of the one or more active regions to the memory controller.

6. The method for refreshing memory of clause 5, further comprising:
when the accelerator operates in the second refresh mode, configuring the memory controller to determine a refresh interval parameter for refreshing based on a total number of the partitions and the number of the one or more active regions.

7. The method for refreshing memory of clause 6, further comprising:
when the accelerator operates in the second refresh mode, updating the total number of the partitions and the number of the one or more active regions at an end of a refresh cycle.

8. The method for refreshing memory of clause 1, further comprising:
selecting between a plurality of refresh modes of operation of the accelerator, wherein the plurality of refresh modes comprises the first refresh mode and a third refresh mode;
when the accelerator operates in the third refresh mode:
allocating data in a plurality of partitions of the memory array based on a lifetime value of the data;
configuring the memory controller to refresh one or more first partitions of the plurality of partitions; and
accessing or refreshing one or more rows storing data with a lifetime value greater than a refresh window value in one or more second partitions of the plurality of partitions.

9. The method for refreshing memory of any one of clauses 1-8, further comprising:
transmitting a mode switching command to configure the memory controller to switch between a plurality of refresh modes when a refresh cycle ends in response to the mode switching command.

10. An accelerator configured to be coupled to a host device, the accelerator comprising:
a memory array configured to store data; and a memory controller configured to access the memory array;

wherein the accelerator is configured to operate in a refresh mode that includes a first refresh mode, wherein in the first refresh mode:

the memory controller is configured to have one or more refresh operations that are disabled, and the memory array is configured to have one or more rows that are to be refreshed by the host device.

11. The accelerator of clause 10, wherein the memory array is refreshed by the host device in the first refresh mode according to a mapping table recording the one or more rows of the memory array containing data with a lifetime value greater than a refresh window value.

12. The accelerator of clause 10 or clause 11, wherein in the first refresh mode, respective refresh tags are assigned for the rows of the memory array and set to a first value when a refresh cycle starts, and the corresponding refresh tag is set to a second value when a read or write operation is applied to one of the rows of the memory array.

13. The accelerator of claim 10, wherein the accelerator is further configured to operate in a second refresh mode, wherein in the second refresh mode:

the memory controller is configured to have one or more refresh operations that are enabled, and the memory controller is configured to refresh one or more active regions, determined by the host device, of the memory array 14. The accelerator of clause 13, wherein the memory controller is configured to receive information of the one or more active regions from the host device in the second refresh mode, the one or more active regions being one or more partitions in the memory array storing data with a lifetime value greater than a refresh window value.

15. The accelerator of clause 14, wherein the memory controller is configured to refresh the memory array with a refresh interval parameter calculated based on a total number of the partitions in the memory array and a number of the one or more active regions.

16. The accelerator of clause 15, wherein the total number of the partitions and the number of the one or more active regions are updated when a refresh cycle ends.

17. The accelerator of any one of clauses 10-16, wherein the accelerator is further configured to operate in a third refresh mode, wherein in the third refresh mode:

the memory controller is configured to refresh one or more first partitions, determined by the host device, of the memory array, and the host device is configured to access or refresh one or more rows storing data with a lifetime value greater than a refresh window value in one or more second partitions, determined by the host device, of the memory array.

18. The accelerator of any one of clauses 10-17, wherein the memory controller is configured to switch between a plurality of refresh modes when a refresh cycle ends in response to a mode switching command from the host device.

19. A non-transitory computer-readable medium that stores a set of instructions that is executable by one or more processors of a host device to cause the host device to perform a method for refreshing memory, the method for refreshing memory comprising:

receiving information of a memory array in an accelerator coupled to the host device; and when the accelerator operates in a first refresh mode, based on the received information:

disabling one or more refresh operations of a memory controller; and refreshing one or more rows of the memory array by the host device.

20. The non-transitory computer-readable medium of clause 19, wherein the set of instructions that is executable by the one or more processors of the host device causes the host device to further perform:

when the accelerator operates in the first refresh mode:

generating a mapping table recording the one or more rows to be refreshed, wherein the one or more rows to be refreshed contain data with a lifetime value greater than a refresh window value; and refreshing the memory array according to the mapping table.

21. The non-transitory computer-readable medium of clause 19 or clause 20, wherein the set of instructions that is executable by the one or more processors of the host device causes the host device to further perform:

when the accelerator operates in the first refresh mode:

assigning respective refresh tags for a plurality of rows of the memory array;

setting the refresh tags to a first value when a refresh cycle starts;

setting the corresponding refresh tag to a second value when a read or write operation is applied to one of the plurality of rows of the memory array; and refreshing the one or more rows of the memory array with the corresponding one or more refresh tags being set to the first value.

22. The non-transitory computer-readable medium of any one of clauses 19-21, wherein the set of instructions that is executable by the one or more processors of the host device causes the host device to further perform:

selecting between a plurality of refresh modes of operation of the accelerator, wherein the plurality of refresh modes comprises the first refresh mode and a second refresh mode; and when the accelerator operates in the second refresh mode:

determining one or more active regions of the memory array, and configuring the memory controller to refresh the one or more active regions.

23. The non-transitory computer-readable medium of any one of clauses 19-22, wherein the set of instructions that is executable by the one or more processors of the host device causes the host device to further perform:

when the accelerator operates in the second refresh mode:

allocating data in a plurality of partitions of the memory array based on a lifetime value of the data;

identifying one or more partitions storing data with a lifetime value greater than a refresh window value as the one or more active regions to be refreshed by the memory controller; and providing information of the one or more active regions to the memory controller.

24. The non-transitory computer-readable medium of clause 23, wherein the set of instructions that is executable by the one or more processors of the host device causes the host device to further perform:

calculating a refresh interval parameter for refreshing based on a total number of the partitions and the number of the one or more active regions.

25. The non-transitory computer-readable medium of clause 24, wherein the set of instructions that is executable by the one or more processors of the host device causes the host device to further perform:
updating the total number of the partitions and the number of the one or more active regions at an end of a refresh cycle; and
calculating the refresh interval parameter for a next refresh cycle based on the updated total number of the partitions and the updated number of the one or more active regions.

26. The non-transitory computer-readable medium of any one of clauses 19-25, wherein the set of instructions that is executable by the one or more processors of the host device causes the host device to further perform:
selecting between a plurality of refresh modes of operation of the accelerator, wherein the plurality of refresh modes comprises the first refresh mode and a third refresh mode; and
when the accelerator operates in the third refresh mode:
allocating data in a plurality of partitions of the memory array based on a lifetime value of the data;
configuring the memory controller to refresh one or more first partitions of the plurality of partitions; and
accessing or refreshing one or more rows storing data with a lifetime value greater than a refresh window value in one or more second partitions of the plurality of partitions.

27. The non-transitory computer-readable medium of any one of clauses 19-26, wherein the set of instructions that is executable by the one or more processors of the host device causes the host device to further perform:
sending a mode switching command to instruct the memory controller to switch between a plurality of refresh modes at an end of a refresh cycle.

28. The computing device of any one of clauses 25-27, wherein when the second refresh mode is selected, the host device is further configured to:
allocate data in a plurality of partitions of the memory array based on a lifetime value of the data;
identify one or more partitions storing data with a lifetime value greater than a refresh window value as the one or more active regions to be refreshed by the memory controller; and
provide information of the one or more active regions to the memory controller.

29. The computing device of clause 28, wherein when the second refresh mode is selected, the memory controller is further configured to calculate a refresh interval parameter for refreshing based on a total number of the partitions and the number of the one or more active regions.

30. The computing device of clause 29, wherein when the second refresh mode is selected, the host device is further configured to update the total number of the partitions and the number of the one or more active regions at an end of a refresh cycle.

31. The computing device of any one of clauses 25-30, wherein the plurality of refresh modes further comprise a third refresh mode, and when the third refresh mode is selected, the host device is further configured to:
allocate data in a plurality of partitions of the memory array based on a lifetime value of the data; and
access or refresh one or more rows storing data with a lifetime value greater than a refresh window value in one or more second partitions of the plurality of partitions;
wherein the memory controller is further configured to refresh one or more first partitions of the plurality of partitions.

32. The computing device of any one of clauses 25-31, wherein the host device is further configured to transmit a mode switching command, and the memory controller is configured to switch between the plurality of refresh modes when a refresh cycle ends in response to the mode switching command.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the disclosure disclosed herein. It is intended that the specification and examples be considered as exemplary only. It is also intended that the sequence of steps shown in figures are only for illustrative purposes and are not intended to be limited to any particular sequence of steps. As such, those skilled in the art can appreciate that these steps can be performed in a different order while implementing the same method. In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

What is claimed is:

1. A method for refreshing memory, comprising:
receiving information of a memory array in an accelerator coupled to a host device;
when the accelerator operates in a first refresh mode, based on the received information:
disabling one or more refresh operations of a memory controller; and
refreshing one or more rows of the memory array by the host device.

2. The method for refreshing memory of claim 1, further comprising:
when the accelerator operates in the first refresh mode:
generating a mapping table recording the one or more rows to be refreshed, wherein the one or more rows to be refreshed contain data with a lifetime value greater than a refresh window value; and
refreshing the memory array according to the mapping table.

3. The method for refreshing memory of claim 1, further comprising:
when the accelerator operates in the first refresh mode:
assigning respective refresh tags for a plurality of rows of the memory array;
setting the refresh tags to a first value when a refresh cycle starts;
setting the corresponding refresh tag to a second value when a read or write operation is applied to one of the plurality of rows of the memory array; and
refreshing the one or more rows of the memory array with the corresponding one or more refresh tags being set to the first value.

4. The method for refreshing memory of claim 1, further comprising:
selecting between a plurality of refresh modes of operation of the accelerator, wherein the plurality of refresh modes comprises the first refresh mode and a second refresh mode, wherein:

when the accelerator operates in the second refresh mode:
determining one or more active regions of the memory array, and
configuring the memory controller to refresh the one or more active regions.

5. The method for refreshing memory of claim 4, further comprising:
when the accelerator operates in the second refresh mode:
allocating data in a plurality of partitions of the memory array based on a lifetime value of the data;
identifying one or more partitions storing data with a lifetime value greater than a refresh window value as the one or more active regions to be refreshed by the memory controller; and
providing information of the one or more active regions to the memory controller.

6. The method for refreshing memory of claim 5, further comprising:
when the accelerator operates in the second refresh mode, configuring the memory controller to determine a refresh interval parameter for refreshing based on a total number of the partitions and the number of the one or more active regions.

7. The method for refreshing memory of claim 6, further comprising:
when the accelerator operates in the second refresh mode, updating the total number of the partitions and the number of the one or more active regions at an end of a refresh cycle.

8. The method for refreshing memory of claim 1, further comprising:
selecting between a plurality of refresh modes of operation of the accelerator, wherein the plurality of refresh modes comprises the first refresh mode and a third refresh mode;
when the accelerator operates in the third refresh mode:
allocating data in a plurality of partitions of the memory array based on a lifetime value of the data;
configuring the memory controller to refresh one or more first partitions of the plurality of partitions; and
accessing or refreshing one or more rows storing data with a lifetime value greater than a refresh window value in one or more second partitions of the plurality of partitions.

9. The method for refreshing memory of claim 1, further comprising:
transmitting a mode switching command to configure the memory controller to switch between a plurality of refresh modes when a refresh cycle ends in response to the mode switching command.

10. An accelerator configured to be coupled to a host device, the accelerator comprising:
a memory array configured to store data; and
a memory controller configured to access the memory array;
wherein the accelerator is configured to operate in a refresh mode that includes a first refresh mode, wherein in the first refresh mode:
the memory controller is configured to have one or more refresh operations that are disabled, and
the memory array is configured to have one or more rows that are to be refreshed by the host device.

11. The accelerator of claim 10, wherein the memory array is refreshed by the host device in the first refresh mode according to a mapping table recording the one or more rows of the memory array containing data with a lifetime value greater than a refresh window value.

12. The accelerator of claim 10, wherein in the first refresh mode, respective refresh tags are assigned for the rows of the memory array and set to a first value when a refresh cycle starts, and the corresponding refresh tag is set to a second value when a read or write operation is applied to one of the rows of the memory array.

13. The accelerator of claim 10, wherein the accelerator is further configured to operate in a second refresh mode, wherein in the second refresh mode:
the memory controller is configured to have one or more refresh operations that are enabled, and
the memory controller is configured to refresh one or more active regions, determined by the host device, of the memory array.

14. The accelerator of claim 13, wherein the memory controller is configured to receive information of the one or more active regions from the host device in the second refresh mode, the one or more active regions being one or more partitions in the memory array storing data with a lifetime value greater than a refresh window value.

15. The accelerator of claim 14, wherein the memory controller is configured to refresh the memory array with a refresh interval parameter calculated based on a total number of the partitions in the memory array and a number of the one or more active regions.

16. The accelerator of claim 15, wherein the total number of the partitions and the number of the one or more active regions are updated when a refresh cycle ends.

17. The accelerator of claim 10, wherein the accelerator is further configured to operate in a third refresh mode, wherein in the third refresh mode:
the memory controller is configured to refresh one or more first partitions, determined by the host device, of the memory array, and
the host device is configured to access or refresh one or more rows storing data with a lifetime value greater than a refresh window value in one or more second partitions, determined by the host device, of the memory array.

18. The accelerator of claim 10, wherein the memory controller is configured to switch between a plurality of refresh modes when a refresh cycle ends in response to a mode switching command from the host device.

19. A non-transitory computer-readable medium that stores a set of instructions that is executable by one or more processors of a host device to cause the host device to perform a method for refreshing memory, the method for refreshing memory comprising:
receiving information of a memory array in an accelerator coupled to the host device; and
when the accelerator operates in a first refresh mode, based on the received information:
disabling one or more refresh operations of a memory controller; and
refreshing one or more rows of the memory array by the host device.

20. The non-transitory computer-readable medium of claim 19, wherein the set of instructions that is executable by the one or more processors of the host device causes the host device to further perform:
when the accelerator operates in the first refresh mode:
generating a mapping table recording the one or more rows to be refreshed, wherein the one or more rows to be refreshed contain data with a lifetime value greater than a refresh window value; and
refreshing the memory array according to the mapping table.

21. The non-transitory computer-readable medium of claim 19, wherein the set of instructions that is executable by the one or more processors of the host device causes the host device to further perform:
  when the accelerator operates in the first refresh mode:
    assigning respective refresh tags for a plurality of rows of the memory array;
    setting the refresh tags to a first value when a refresh cycle starts;
    setting the corresponding refresh tag to a second value when a read or write operation is applied to one of the plurality of rows of the memory array; and
    refreshing the one or more rows of the memory array with the corresponding one or more refresh tags being set to the first value.

22. The non-transitory computer-readable medium of claim 19, wherein the set of instructions that is executable by the one or more processors of the host device causes the host device to further perform:
  selecting between a plurality of refresh modes of operation of the accelerator, wherein the plurality of refresh modes comprises the first refresh mode and a second refresh mode; and
  when the accelerator operates in the second refresh mode:
    determining one or more active regions of the memory array, and
    configuring the memory controller to refresh the one or more active regions.

23. The non-transitory computer-readable medium of claim 19, wherein the set of instructions that is executable by the one or more processors of the host device causes the host device to further perform:
  when the accelerator operates in the second refresh mode:
    allocating data in a plurality of partitions of the memory array based on a lifetime value of the data;
    identifying one or more partitions storing data with a lifetime value greater than a refresh window value as the one or more active regions to be refreshed by the memory controller; and
    providing information of the one or more active regions to the memory controller.

24. The non-transitory computer-readable medium of claim 23, wherein the set of instructions that is executable by the one or more processors of the host device causes the host device to further perform:
  calculating a refresh interval parameter for refreshing based on a total number of the partitions and the number of the one or more active regions.

25. The non-transitory computer-readable medium of claim 24, wherein the set of instructions that is executable by the one or more processors of the host device causes the host device to further perform:
  updating the total number of the partitions and the number of the one or more active regions at an end of a refresh cycle; and
  calculating the refresh interval parameter for a next refresh cycle based on the updated total number of the partitions and the updated number of the one or more active regions.

26. The non-transitory computer-readable medium of claim 19, wherein the set of instructions that is executable by the one or more processors of the host device causes the host device to further perform:
  selecting between a plurality of refresh modes of operation of the accelerator, wherein the plurality of refresh modes comprises the first refresh mode and a third refresh mode; and
  when the accelerator operates in the third refresh mode:
    allocating data in a plurality of partitions of the memory array based on a lifetime value of the data;
    configuring the memory controller to refresh one or more first partitions of the plurality of partitions; and
    accessing or refreshing one or more rows storing data with a lifetime value greater than a refresh window value in one or more second partitions of the plurality of partitions.

27. The non-transitory computer-readable medium of claim 19, wherein the set of instructions that is executable by the one or more processors of the host device causes the host device to further perform:
  sending a mode switching command to instruct the memory controller to switch between a plurality of refresh modes at an end of a refresh cycle.

* * * * *